(12) United States Patent
Kim (10) Patent No.: US 11,567,137 B2
(45) Date of Patent: Jan. 31, 2023

(54) BATTERY MANAGEMENT SYSTEM, BATTERY MANAGEMENT METHOD, BATTERY PACK AND ELECTRIC VEHICLE

(71) Applicant: LG CHEM, LTD., Seoul (KR)

(72) Inventor: Young-Jin Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 107 days.

(21) Appl. No.: 17/263,717

(22) PCT Filed: Feb. 7, 2020

(86) PCT No.: PCT/KR2020/001773
§ 371 (c)(1),
(2) Date: Jan. 27, 2021

(87) PCT Pub. No.: WO2020/171442
PCT Pub. Date: Aug. 27, 2020

(65) Prior Publication Data
US 2021/0199724 A1 Jul. 1, 2021

(30) Foreign Application Priority Data
Feb. 22, 2019 (KR) .......................... 10-2019-0021448
Feb. 4, 2020 (KR) .......................... 10-2020-0013286

(51) Int. Cl.
*G01R 31/00* (2006.01)
*G01R 31/382* (2019.01)
(Continued)

(52) U.S. Cl.
CPC ............. *G01R 31/382* (2019.01); *G01K 7/22* (2013.01); *H01M 10/425* (2013.01);
(Continued)

(58) Field of Classification Search
USPC ......................................... 324/426, 432–435
See application file for complete search history.

(56) References Cited

U.S. PATENT DOCUMENTS

| 6,366,054 B1 | 4/2002 | Hoenig et al. |
| 7,352,156 B2 | 4/2008 | Ashizawa et al. |

(Continued)

FOREIGN PATENT DOCUMENTS

| JP | 2004-514249 A | 5/2004 |
| JP | 2007-33112 A | 2/2007 |

(Continued)

OTHER PUBLICATIONS

Extended European Search Report dated Nov. 12, 2021 issued by the European Patent Office for corresponding European patent application No. 20758685.0.

(Continued)

*Primary Examiner* — Vincent Q Nguyen
(74) *Attorney, Agent, or Firm* — Morgan, Lewis & Bockius LLP (57) ABSTRACT

Provided are a battery management system, a battery management method, a battery pack and an electric vehicle. The battery management system includes a sensing unit to generate battery information indicating a current, a voltage and a temperature of a battery, and a control unit. The control unit determines a temporary estimate for a SOC in a current cycle using a time update process of an extended Kalman filter based on a previous estimate indicating a SOC in a previous cycle and the battery information. The control unit determines open circuit voltage (OCV) information based on the temporary estimate. The control unit determines a definitive estimate indicating the SOC in the current cycle using (Continued)

a measurement update process of the extended Kalman filter based on the temporary estimate, the OCV information and the battery information.

18 Claims, 6 Drawing Sheets

(51) Int. Cl.
  *G01K 7/22* (2006.01)
  *H01M 10/42* (2006.01)
  *H01M 10/48* (2006.01)
(52) U.S. Cl.
  CPC .. *H01M 10/482* (2013.01); *H01M 2010/4271* (2013.01); *H01M 2220/20* (2013.01)

(56) References Cited

U.S. PATENT DOCUMENTS

| | | |
|---|---|---|
| 2003/0052690 A1 | 3/2003 | Schoch |
| 2007/0005276 A1 | 1/2007 | Cho et al. |
| 2007/0145948 A1 | 6/2007 | Lim et al. |
| 2014/0149058 A1 | 5/2014 | Moh |
| 2014/0214348 A1 | 7/2014 | Sahinoglu et al. |
| 2014/0316728 A1* | 10/2014 | Zhong ................ G01R 31/374 702/63 |
| 2015/0112622 A1 | 4/2015 | Uchino |
| 2016/0049821 A1 | 2/2016 | Aridome |
| 2019/0137573 A1* | 5/2019 | Hatano ................ H01M 10/48 |

FOREIGN PATENT DOCUMENTS

| | | |
|---|---|---|
| JP | 4132036 B2 | 8/2008 |
| JP | 2012-47580 A | 3/2012 |
| JP | 2015-78918 A | 4/2015 |
| JP | 5812032 B2 | 11/2015 |
| JP | 2015-215258 A | 12/2015 |
| KR | 10-2006-0129962 A | 12/2006 |
| KR | 10-0669470 B1 | 1/2007 |
| KR | 10-2014-0066394 A | 6/2014 |
| KR | 10-2018-0031413 A | 3/2018 |
| KR | 10-2018-0116988 A | 10/2018 |

OTHER PUBLICATIONS

International Search Report issued in corresponding International Patent Application No. PCT/KR2020/001773, dated May 20, 2020.

* cited by examiner

BATTERY MANAGEMENT SYSTEM, BATTERY MANAGEMENT METHOD, BATTERY PACK AND ELECTRIC VEHICLE

TECHNICAL FIELD

The present disclosure relates to battery state of charge (SOC) estimation using an extended Kalman filter.

BACKGROUND ART

Recently, there has been dramatically growing demand for portable electronic products such as laptop computers, video cameras and mobile phones, and with the extensive development of electric vehicles, accumulators for energy storage, robots and satellites, many studies are being made on batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus (hey are gaining more attention than nickel-based batteries for their advantages that recharging can be done whenever it is convenient, the self-discharge rate is very low and the energy density is high.

One of important parameters required to control the charge/discharge of a battery is State of Charge (SOC). The SOC is a parameter indicating a relative ratio of the remaining capacity to the maximum capacity indicating electrical energy stored in the battery when the battery is fully charged, and may be expressed as 0 to 1 or 0% to 100%. For example, when the maximum capacity and the remaining capacity of the battery are 1000 Ah (ampere-hour) and 750 Ah respectively, the SOC of the battery is 0.75 (or 75%).

Ampere counting, an equivalent circuit model and the extended Kalman filter are typically used to estimate the SOC of the battery. The ampere counting is the technique that estimates the SOC of the battery based on a cumulative current value corresponding to the current flowing through the battery accumulated over time. The equivalent circuit model is designed to model the connection relationship between electrical components to simulate the electrochemical properties of the battery.

However, due to a measurement error of a current sensor and/or external noise, the ampere counting may have a discrepancy between the SOC estimated by ampere counting and the actual SOC. Additionally, it is very difficult to design the equivalent circuit model for sufficiently simulating the nonlinear characteristic of the battery associated with a rapid change in open circuit voltage (OCV) within a predetermined range in which the SOC is close to the full discharge state.

The extended Kalman filter is the mathematically combined technique of the ampere counting and the equivalent circuit model to make up for the drawback of each of the ampere counting and the equivalent circuit model.

However, even though the extended Kalman filter is used, when the above-described nonlinear characteristic is very strong, an error may occur to the estimate of SOC of the battery.

DISCLOSURE

Technical Problem

The present disclosure is designed to solve the above-described problem, and therefore the present disclosure is directed to providing a battery management system, a battery management method, a battery pack and an electric vehicle in which in estimating (updating) the SOC of the battery in each cycle using the extended Kalman filter, open circuit voltage (OCV) information is determined based on the results of comparison between the temporary estimate indicating the SOC in the current cycle and the reference range strongly showing the nonlinear characteristic, then a definitive estimate indicating the SOC in the current cycle is determined based on the OCV information.

The present disclosure is further directed to providing a battery management system, a battery management method and a battery pack in which the SOC of the battery is estimated with higher reliability by adjusting the maximum value of the reference range based on the maximum capacity associated with the degradation level of the battery.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure includes a sensing unit configured to generate battery information indicating a current, a voltage and a temperature of a battery, and a control unit configured to estimate a state of charge (SOC) of the battery using an extended Kalman filter based on the battery information. The control unit is configured to determine a temporary estimate for a SOC in a current cycle using a time update process of the extended Kalman filter based on a previous estimate and the battery information. The previous estimate indicates a SOC in a previous cycle. The control unit is configured to determine open circuit voltage (OCV) information based on the temporary estimate. The control unit is configured to determine a definitive estimate indicating the SOC in the current cycle using a measurement update process of the extended Kalman filter based on the temporary estimate, the OCV information and the battery information.

The OCV information may include a first OCV factor value. The control unit may be configured to determine the first OCV factor value to be equal to a predetermined first slope control value when the temporary estimate is outside of a reference range.

The control unit may be configured to determine the first OCV factor value to be equal to a second slope control value when the temporary estimate is within the reference range. The second slope control value is smaller than the first slope control value.

The control unit may be configured to determine a maximum value of the reference range based on a maximum capacity of the battery.

The control unit may be configured to increase the maximum value of the reference range as a difference between a design capacity of the battery and the maximum capacity increases.

The OCV information may include a second OCV factor value. The control unit may be configured to determine the second OCV factor value to be equal to a first OCV corresponding to the temporary estimate from a data table defining a correspondence relationship between the SOC and the OCV of the battery when the temporary estimate is outside of the reference range.

The control unit may be configured to determine the second OCV factor value to be equal to a second OVC corresponding to the maximum value of the reference range when the temporary estimate is within the reference range. The maximum value of the reference range is equal to or larger than a predetermined reference value.

A battery pack according to another aspect of the present disclosure includes the battery management system.

An electric vehicle according to still another aspect of the present disclosure includes the battery pack.

A battery management method according to yet another aspect of the present disclosure may be executable by the battery management system. The battery management method includes collecting battery information indicating a current, a voltage and a temperature of the battery, determining a temporary estimate for a SOC in a current cycle using a time update process of an extended Kalman filter based on a previous estimate indicating a SOC in a previous cycle and the battery information, determining OCV information based on the temporary estimate, and determining a definitive estimate indicating the SOC in the current cycle using a measurement update process of the extended Kalman filter based on the temporary estimate, the OCV information and the battery information.

Determining the OCV information may determining a first OCV factor value to be equal to a predetermined first slope control value when the temporary estimate is outside of a reference range, and determining the first OCV factor value to be equal to a second slope control value when the temporary estimate is within the reference range, the second slope control value being smaller than the first slope control value. The OCV information may include the first OCV factor value.

Determining the OCV information may include determining a second OCV factor value to be equal to an OCV corresponding to the temporary estimate from a data table defining a correspondence relationship between the SOC and the OCV of the battery when the temporary estimate is outside of a reference range, and determining the second OCV factor value to be equal to a threshold voltage associated with the reference range when the temporary estimate is within the reference range. The OCV information may include the second OCV factor value.

Advantageous Effects

According to at least one of the embodiments of the present disclosure, in estimating (updating) the SOC of the battery in each cycle using the extended Kalman filter, open circuit voltage (OCV) information may be determined based on the results of comparison between the temporary estimate indicating the SOC in the current cycle and the reference range strongly showing the nonlinear characteristic, and a definitive estimate indicating the SOC in the current cycle may be determined based on the OCV information. Accordingly, it is possible to reduce the adverse influence of a rapid change in OCV due to the nonlinear characteristic of the battery on the accuracy of battery SOC estimation.

Additionally, according to at least one of the embodiments of the present disclosure, it is possible to estimate the SOC of the battery with higher reliability by adjusting the maximum value of the reference range based on the maximum capacity associated with the degradation level of the battery.

The effects of the present disclosure are not limited to the effects mentioned above, and these and other effects will be clearly understood by those skilled in the art from the appended claims.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by either hardware or software or a combination of hardware and software.

In addition, throughout the specification, it will be further understood that when an element is referred to as being "connected to" another element, it can be directly connected to the other element or intervening elements may be present.

Figure 1:
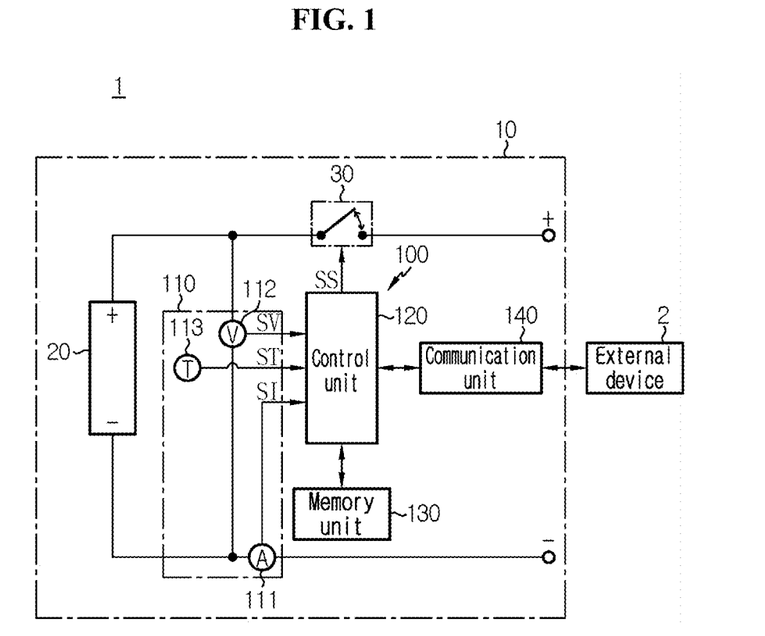
FIG. 1 is an exemplary diagram of a configuration of an electric vehicle according to the present disclosure.
Figure 2:
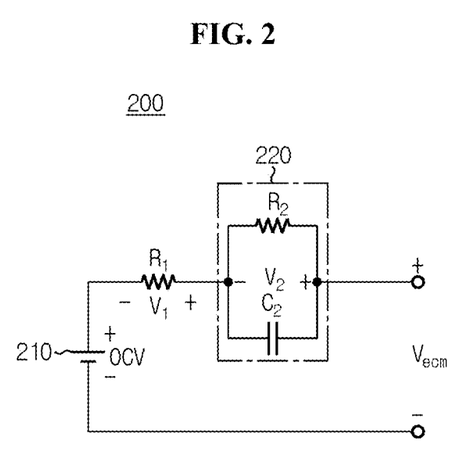
FIG. 2 is an exemplary diagram of a circuit configuration of an equivalent circuit model of a battery.
Figure 3:
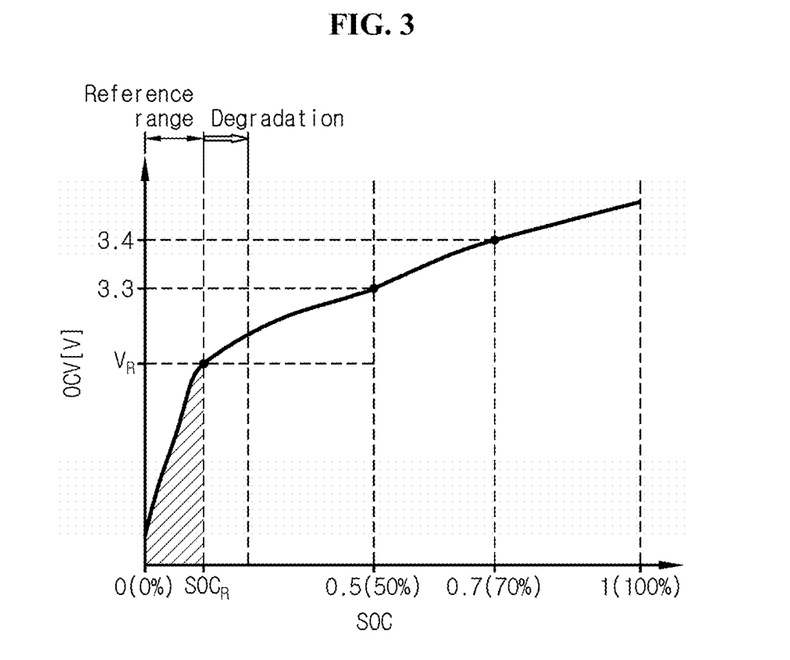
FIG. 3 is an exemplary diagram of an open circuit voltage (OCV)-state of charge (SOC) curve of a battery.

FIG. 1 is an exemplary diagram of a configuration of an electric vehicle according to the present disclosure, FIG. 2 is an exemplary diagram of a circuit configuration of an equivalent circuit model of a battery, and FIG. 3 is an exemplary diagram of an open circuit voltage (OCV)-state of charge (SOC) curve of the battery.

Referring to FIG. 1, a battery pack 10 is configured to supply electrical energy required for an electricity powered device such as an electric vehicle 1, and includes a battery 20, a switch 30 and a battery management system 100.

The battery 20 includes at least one battery cell. Each battery cell may be, for example, a lithium ion cell. Of course, the type of the battery cell is not limited to the lithium ion cell, and may include, without limitation, any type that can be recharged repeatedly. Each battery cell included in the battery 20 is electrically connected to other battery cell in series or in parallel.

The switch 30 is installed on a current path for charging and discharging the battery 20. A control terminal of the switch 30 is provided to be electrically connected to a control unit 120. The switch 30 is controlled to be turned on and off according to the duty cycle of a switching signal SS outputted by the control unit 120, in response to the switching signal SS being applied to the control terminal. When the switching signal SS is high-level, the switch 30 may be turned on, and when the switching signal SS is low-level, the switch 30 may be turned off. The current flowing through the current path is controlled by turning on and off the switch 30.

The battery management system 100 is provided to be electrically connected to the battery 20 to periodically determine the SOC of the battery 20. The battery management system 100 includes a sensing unit 110, the control unit 120, a memory unit 130 and a communication unit 140.

The sensing unit 110 is configured to periodically generate battery information indicating the voltage, current and temperature of the battery 20 during charging/discharging of the battery 20. The sensing unit 110 includes a current sensor 111, a voltage sensor 112 and a temperature sensor 113.

The current sensor 111 is provided to be electrically connected to the charge/discharge path of the battery 20. The current sensor 111 is configured to output a signal SI indicating the magnitude and direction of the current flowing through the battery 20 to the control unit 120. For example, a shunt resistor and/or a hall effect device may be used as the current sensor 111.

The voltage sensor 112 is provided to be electrically connected to positive and negative terminals of the battery 20. The voltage sensor 112 is configured to detect the voltage across the positive and negative terminals of the battery 20, and output a signal SV indicating the detected voltage to the control unit 120.

The temperature sensor 113 is configured to detect the temperature of an area within a predetermined distance from the battery 20, and output a signal ST indicating the detected temperature to the control unit 120. For example, a thermistor having the negative temperature coefficient may be used as the temperature sensor 113.

The control unit 120 is operably coupled to the sensing unit 110, the memory unit 130, the communication unit 140 and the switch 30. The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 120 is configured to periodically receive the signal SI, the signal SV and the signal ST outputted by the sensing unit 110 as the battery information. The control unit 120 may determine a current value, a voltage value and a temperature value from the signal SI, the signal SV and the signal ST respectively using an analog-to-digital converter (ADC) included in the control unit 120, and store them in the memory unit 130.

The memory unit 130 is operably coupled to the control unit 120. The memory unit 130 may store programs and data necessary to perform the steps described below. The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The communication unit 140 may be coupled to an external device 2 to enable communication. For example, the external device 2 may be an Electronic Control Unit (ECU) of the vehicle 1. The communication unit 140 may receive a command message from the external device 2, and provide the received command message to the control unit 120. The command message may be a message requesting the activation of a specific function (e.g., SOC estimation, control of ON/OFF of the switch 30) of the battery management system 100. The communication unit 140 may send a notification message from the control unit 120 to the external device 2. The notification message may be a message for notifying the result (e.g., an estimate of SOC) of the function performed by the control unit 120 to the external device 2. For example, the communication unit 140 may communicate with the external device 2 via a wired network such as a local area network (LAN), a controller area network (CAN) and a daisy chain and/or a short range wireless network, for example, Bluetooth, Zigbee and WiFi.

The control unit 120 is configured to determine the maximum capacity or the state of health (SOH) of the battery 20. The maximum capacity indicates the maximum amount of charges that can be stored in the battery 20, and may be referred to as 'full charge capacity'. For example, the maximum capacity is equal to the cumulative value of currents flowing during discharging of the battery 20 at SOC of 1 (=100%) until the SOC is 0 (=0%).

The control unit 120 may calculate the internal resistance of the battery 20, and determine the SOH or the maximum capacity of the battery 20 based on a difference between the reference resistance and the internal resistance or a ratio of the internal resistance to the reference resistance. Alternatively, the control unit 120 may determine the SOH or the maximum capacity of the battery 20, based on the SOC at each of different time points at which the battery 20 is charged and discharged and the cumulative current value for a period of time between the two time points, using the following Equation 1. Assume that the earlier time point of the two time points is $t_1$, and the later time point is $t_2$.

$$SOH_{new} = \frac{\int_{t_1}^{t_2} i_t dt}{SOC_2 - SOC_1} = \frac{\Delta C}{\Delta SOC} = \frac{Q_{est}}{Q_{ref}} \qquad \text{(Equation 1)}$$

In Equation 1, $Q_{ref}$ denotes reference capacity, $SOC_1$ denotes SOC estimated at the time point $t_1$, $SOC_2$ denotes SOC estimated at the time point $t_2$, $\Delta SOC$ denotes a difference between $SOC_1$ and $SOC_2$, $i_t$ denotes a current value indicating the current detected at a time point t between the time point $t_1$ and the time point $t_2$, $\Delta C$ denotes the cumulative current value for a period of time from the time point $t_1$ to the time point $t_2$, $Q_{est}$ denotes an estimate of maximum capacity at the time point $t_2$, and $SOH_{new}$ denotes an estimate of SOH at the time point $t_2$. $Q_{ref}$ is a preset value indicating the maximum capacity when the SOH of the battery 20 is 1. $Q_{ref}$ may be referred to as 'design capacity', and may be pre-stored in the memory unit 130.

In relation to Equation 1, when $\Delta SOC$ is too small, $Q_{est}$ may be greatly different from the actual one. Accordingly, the control unit 120 may be configured to determine the SOH or the maximum capacity of the battery 20 using Equation 1 only when $\Delta SOC$ is equal to or larger than a predetermined value (e.g., 0.5).

In determining the maximum capacity (or SOH), to exclude the influence of the above-described nonlinear characteristic, only when both of $SOC_1$ and $SOC_2$ do not fall in the reference range as described below, the control unit 120 may be configured to determine the maximum capacity of the battery 20 using Equation 1.

Hereinafter, the operation for estimating the SOC of the battery 20, performed by the control unit 120, will be described in more detail.

The control unit 120 may calculate an estimate of SOC of the battery 20 in the current cycle using the ampere counting (see Equation 2) based on the current value of the battery information.

$$SOC[k+1] = SOC_e[k] + \frac{i[k+1]\Delta t}{Q_{est}} \qquad \langle \text{Equation 2} \rangle$$

Below is the description of the symbols used in Equation 2. $\Delta t$ denotes the time length per cycle. K is a time index that increases by 1 each time $\Delta t$ passes away, and indicates the number of cycles from the time point at which a predetermined event occurred to the current time point. The event may be, for example, the start of charging and discharging of the battery 20 of which voltage is stabilized. The battery 20 of which voltage is stabilized may be the battery 20 on no-load condition in which the current does not flow through the battery 20 and the voltage of the battery 20 is uniformly maintained. In this case, $SOC_e[0]$ may be determined from a data table defining a correspondence relationship between OCV and SOC of the battery 20 (see the OCV-SOC curve shown in FIG. 3) using the OCV of the battery 20 at the time point when the event occurred as an index. The data table is stored in the memory unit 130.

In Equation 2, $i[k+1]$ denotes the current detected in the current cycle, and $SOC_e[k]$ denotes the SOC determined in the previous cycle by the extended Kalman filter. $SOC[k+1]$ is a value indicating the SOC in the current cycle calculated using the ampere counting. In Equation 2, $i[k+1]$ may be replaced with $i[k]$.

Hereinafter, the extended Kalman filter will be described. The extended Kalman filter is an algorithm for periodically updating the SOC of the battery 20, by additionally using the equivalent circuit model 200 of the battery 20 together with the ampere counting represented by Equation 2.

Referring to FIG. 2, the equivalent circuit model 200 includes an OCV source 210, an ohm resistor $R_1$ and a resistor-capacitor (RC) pair 220.

The OCV source 210 simulates the OCV that is the voltage between the positive and negative electrodes of the battery 20 electrochemically stabilized for a long term. The OCV outputted by the OCV source 210 is in a nonlinear functional relationship with the SOC of the battery 20. That is, $OCV=f_1(SOC)$, $SOC=f_2(OCV)$, and $f_1$ and $f_2$ are inverse functions of each other. For example, referring to FIG. 3, 3.3 V=$f_1(0.5)$, and 0.7=$f_2(3.4\ V)$.

The OCV outputted by the OCV source 210 may be preset by SOC and temperature through experimentation.

The ohm resistor $R_1$ is associated with IR drop $V_1$ of the battery 20. The IR drop refers to an instantaneous change in voltage across the battery 20 when the battery 20 is switched from the no-load condition to the charging/discharging condition or from the charging/discharging condition to the no-load condition. In an example, the voltage of the battery 20 measured at the time point when the battery 20 on no-load condition starts charging is higher than the OCV. In another example, the voltage of the battery 20 measured at the time point when the battery 20 on no-load condition starts discharging is lower than the OCV. The resistance value of the ohm resistor $R_1$ may be also preset by SOC and temperature through experimentation.

The RC pair 220 outputs overpotential (also known as 'polarization voltage') $V_2$ occurred by an electric double layer of the battery 20, etc., and includes a resistor $R_2$ and a capacitor $C_2$ connected in parallel. The overpotential $V_2$ may be referred to as 'polarization voltage'. The time constant of the RC pair 220 is the multiplication of the resistance value of the resistor $R_2$ by the capacitance of the capacitor $C_2$, and may be preset by SOC and temperature through experimentation.

$V_{ecm}$ is an output voltage of the equivalent circuit model 200, and equals the sum of the OCV from the OCV source 210, the IR drop $V_1$ across the ohm resistor $R_1$ and the overpotential $V_2$ across the RC pair 220.

In the equivalent circuit model 200, the overpotential in the current cycle may be defined as the following Equation 3.

$$V_2[k+1] = V_2[k]e^{-\frac{\Delta t}{\tau[k+1]}} + R_2[k+1]i[k+1]\left(1 - e^{-\frac{\Delta t}{\tau[k+1]}}\right) \qquad \langle \text{Equation 3} \rangle$$

In Equation 3, $R_2[k+1]$ denotes the resistance value of the resistor $R_2$ in the current cycle, $\tau[k+1]$ denotes the time constant of the RC pair 220 in the current cycle, $V_2[k]$ denotes the overpotential in the previous cycle, and $V_2[k+1]$ denotes the overpotential in the current cycle. In Equation 3, $i[k+1]$ may be replaced with $i[k]$. The overpotential $V_2[0]$ at the time point when the event occurred may be 0 V (volt).

The following Equation 4 is a first state equation associated with the time update process of the extended Kalman filter, and is derived from a combination of Equation 2 and Equation 3.

$$\hat{x}_{k+1}^- = \begin{pmatrix} SOC[k+1] \\ V_2[k+1] \end{pmatrix} = A\hat{x}_k + Bi[k+1] \qquad \langle \text{Equation 4} \rangle$$

$$\hat{x}_k = \begin{pmatrix} SOC_e[k] \\ V_2[k] \end{pmatrix}$$

$$A = \begin{pmatrix} 1 & 0 \\ 0 & e^{-\frac{\Delta t}{\tau[k+1]}} \end{pmatrix}$$

$$B = \begin{pmatrix} \frac{\Delta t}{Q_{est}} \\ R_2[k+1]\left(1 - e^{-\frac{\Delta t}{\tau[k+1]}}\right) \end{pmatrix}$$

In Equation 4 and the following Equations 5 to 8, the superscripted symbol ^ indicates a value estimated by time updates. Additionally, the superscripted symbol ⁻ indicates a value before correction by measurement updates described below. $SOC[k+1]$ of Equation 4 is an estimate temporarily indicating the SOC in the current cycle, and may be referred to as 'temporary estimate'. $SOC_e[k]$ of Equation 4 is a definitive estimate indicating the SOC in the previous cycle, and may be referred to as 'previous estimate'.

The following Equation 5 is a second state equation associated with the time update process of the extended Kalman filter.

$$P^-_{k+1} = AP_k A^T + Q_k \quad \text{(Equation 5)}$$
$$Q_k = \begin{pmatrix} W1_k & 0 \\ 0 & W2_k \end{pmatrix}$$

In Equation 5, $P_k$ denotes an error covariance matrix corrected in the previous cycle, $Q_k$ denotes a process noise covariance matrix in the previous cycle, T denotes a transpose operator, and $P^-{k+1}$ denotes an error covariance matrix in the current cycle. In k=0, $P_0$=[1 0; 0 1]. $W1_k$ is first process noise, and is associated with reliability of the ampere counting. $W1_k$, is a predetermined positive number indicating inaccuracy of the cumulative current value calculated using the ampere counting. $W2_k$ is second process noise, and is associated with reliability of the equivalent circuit model 200. $W2_k$ is a predetermined positive number indicating inaccuracy of the parameters associated with the equivalent circuit model 200.

The control unit 120 may determine OCV information based on the temporary estimate SOC[k+1]. The OCV information includes at least one of a first OCV factor value and a second OCV factor value. The first OCV factor value and the second OCV factor value will be each described in more detail below.

When the time update process using Equation 4 and Equation 5 is completed, the control unit 120 performs a measurement update process.

The following Equation 6 is a first observation equation associated with the measurement update process of the extended Kalman filter.

$$K_{k+1} = P^-_{k+1} H^T_{k+1} (H_{k+1} P^-_{k+1} H^T_{k+1} + R)^{-1} \quad \text{(Equation 6)}$$
$$H^T_{k+1} = \begin{pmatrix} \dfrac{f_1(SOC[k+1]+0.01u) - f_1(SOC[k+1]-0.01u)}{2n} \\ 1 \end{pmatrix}$$

In Equation 6, $K_{k+1}$ denotes a Kalman gain in the current cycle. R is a measurement noise covariance matrix, and has preset components.

In Equation 6, $H_{k+1}$ is a system matrix. The component in the first row and the first column of $H_{k+1}$ indicates change trend in OCV of the battery 20 according to the data table defining the OCV-SOC curve shown in FIG. 3 in estimating the SOC of the battery 20 in the current cycle. n of $H_{k+1}$ is a preset positive integer (e.g., 1).

The change trend in OCV may indicate an OCV range of interest corresponding to a SOC range of interest having the temporary estimate SOC[k+1] as the middle value. An OCV corresponding to the minimum value of the SOC range of interest may be equal to the minimum value of the OCV range of interest. An OCV corresponding to the maximum value of the SOC range of interest may be equal to the maximum value of the OCV range of interest.

u denotes the first OCV factor value, and is a positive number for adjusting the SOC range of interest required to set the change trend in OCV. Accordingly, the OCV range of interest corresponding to the SOC range of interest is adjusted by adjusting u.

The SOC range of interest is a difference between SOC [k+1]+0.01u and SOC[k+1]−0.01u, i.e., 0.02u. The OCV range of interest is a difference between $f_1$(SOC[k+1]+0.01u) and $f_1$(SOC[k+1]−0.01u). For example, when SOC [k+1] is fixed, as u decreases, the minimum value $f_1$(SOC [k+1]−0.01u) of the OCV range of interest increases, and the maximum value $f_1$(SOC[k+1]+0.01u) of the OCV range decreases. Of course, when SOC[k+1] is fixed, as u increases, the minimum value of the OCV range of interest decreases and the maximum value of the OCV range of interest increases.

The control unit 120 may adjust the first OCV factor value u based on the results of comparison between the temporary estimate SOC[k+1] and the reference range. The reference range (see FIG. 3) is a SOC range in which the nonlinear characteristic is above a predetermined level, and may be set through experimentation.

The minimum value of the reference range may be 0% indicating fully discharged state. The maximum value ($SOC_R$ in FIG. 3) of the reference range indicates the boundary between an area in which the nonlinear characteristic is exhibited and the remaining area.

The control unit 120 may determine the maximum value $SOC_R$ of the reference range based on the maximum capacity $Q_{est}$ of the battery. In detail, as a difference between the design capacity $Q_{ref}$ and the maximum capacity $Q_{est}$ increases (i.e., as the battery 20 degrades), the control unit 120 may increase the maximum value $SOC_R$ of the reference range. It is because as the battery 20 degrades, the internal electrochemical state of the battery 20 becomes unstable and the area in which the nonlinear characteristic is exhibited may expand. For example, when a difference between the design capacity $Q_{ref}$ and the maximum capacity $Q_{est}$ is less than a predetermined reference difference value, the predetermined reference value (e.g., 5%) may be determined as the maximum value $SOC_R$ of the reference range. The reference value may indicate the SOC at the boundary between the area in which the nonlinear characteristic of the battery 20 is exhibited and the remaining area when the battery 20 is at Beginning Of Life. When the difference between the design capacity $Q_{ref}$ and the maximum capacity $Q_{est}$ is equal to or larger than the reference difference value, the sum of (i) the difference between the design capacity $Q_{ref}$ and the maximum capacity $Q_{est}$ multiplied by a predetermined scaling coefficient and (ii) the reference value may be determined as the maximum value $SOC_R$ of the reference range. Of course, the maximum value $SOC_R$ of the reference range may be fixed to be equal to the reference value irrespective of the maximum capacity $Q_{est}$.

When the temporary estimate SOC[k+1] is outside of the reference range, the control unit 120 may determine the first OCV factor value u to be equal to a predetermined first slope control value. On the contrary, when the temporary estimate SOC[k+1] is within the reference range, the control unit 120 may determine the first OCV factor value u to be equal to a predetermined second slope control value. The second slope control value may be smaller than the first slope control value. For example, the first slope control value may be 1 that is equal to n, and the second slope control value may be 0.5 that is smaller than n. The first slope control value and the second slope control value may be preset based on experimental results.

The OCV range of interest when the first OCV factor value u is equal to the second slope control value is narrower than the OCV range of interest when the first OCV factor value u is equal to the first slope control value. Accordingly, when the temporary estimate SOC[k+1] is within the reference range, changes in OCV of the battery 20 strongly showing the nonlinear characteristic may be precisely reflected on $H_{k+1}$. Of course, the first OCV factor value u may be a constant (e.g., equal to n) irrespective of the temporary estimate SOC[k+1].

The following Equation 7 is a second observation equation associated with the measurement update process of the extended Kalman filter. SOC[k+1] and $V_2$[k+1] obtained from Equation 4 are each corrected by Equation 7.

$$\hat{x}_{k+1} = \begin{pmatrix} SOC_e[k+1] \\ V_{2e}[k+1] \end{pmatrix}$$
$$= \hat{x}_{k+1}^- + K_{k+1}\{z_{k+1} - (f_1(SOC[k+1]) + V_1[k+1] + V_2[k+1])\}$$

<Equation 7>

In Equation 7, $z_{k+1}$ denotes the voltage of the battery 20 measured in the current cycle, $V_1$[k+1] denotes the voltage across the ohm resistor $R_1$ in the current cycle, and may equal the multiplication of any one of i[k+1] and i[k] by $R_1$[k+1]. $R_1$[k+1] is the resistance value of the ohm resistor $R_1$ in the current cycle. The control unit 120 may determine $R_1$[k+1] based on the temperature value of the battery information. To this end, the memory unit 130 records a first lookup table defining a correspondence relationship between the temperature value and the resistance value of the ohm resistor $R_1$. The control unit 120 may obtain the resistance value mapped to the temperature value in the current cycle as $R_1$[k+1] from the first lookup table using the temperature value in the current cycle as an index.

In Equation 7, $f_1$(SOC[k+1]) denotes the second OCV factor value. When the temporary estimate SOC[k+1] is outside of the reference range, the control unit 120 may determine the OCV corresponding to the temporary estimate SOC[k+1] as the second OCV factor value from the data table (see FIG. 3). In this case, $f_1$(SOC[k+1]) indicates an estimate of OCV in the current cycle. On the contrary, when the temporary estimate SOC[k+1] is within the reference range, the control unit 120 may determine the OCV ($V_R$ in FIG. 2) corresponding to the maximum value $SOC_R$ of the reference range as the second OCV factor value from the data table (see FIG. 3).

Additionally, the control unit 120 sets i[k+1](or i[k]) of Equation 4 to be equal to the current value and $z_{k+1}$ of Equation 7 to be equal to the voltage value of the battery information. Accordingly, the control unit 120 may obtain $SOC_e$[k+1] by correcting the temporary estimate SOC[k+1] using Equation 7. $SOC_e$[k+1] is a value determined as an estimate for SOC of the battery 20 in the current cycle, and may be referred to as 'definitive estimate'. For reference, $V_{2e}$[k+1] is the result of correcting $V_2$[k+1] of Equation 4 by Equation 7. $SOC_e$[k+1] is used for $SOC_e$[k] of Equation 4 in the next cycle.

The following Equation 8 is a third observation equation associated with the measurement update process of the extended Kalman filter.

$$P_{k+1} = (E - K_{k+1} H_{k+1}) P_{k+1}^-$$ <Equation 8>

In Equation 8, E denotes the unit matrix. $P'_{k+1}$ obtained from Equation 5 is corrected to $P_{k+1}$ by Equation 8.

The control unit 120 updates the definitive estimate indicating the SOC of the battery 20 in each cycle by performing each calculation step of Equations 4 to 8 at least once each time the time index k increases by 1.

The control unit 120 determines $R_2$[k+1] and $\tau$[k+1] of Equation 4 based on the temperature value and the SOC determined in the previous cycle. The memory unit 130 may record a second lookup table defining a correspondence relationship between the SOC, the temperature value and the resistance value of the resistor $R_2$. The control unit 120 may obtain the resistance value mapped to the temperature value and the SOC determined in the previous cycle as $R_2$[k+1] of Equation 4 from the second lookup table using the temperature value and the SOC determined in the previous cycle as an index. Additionally, the memory unit 130 may record a third lookup table defining a correspondence relationship between the SOC, the temperature value and the time constant. The control unit 120 may obtain the time constant mapped to the temperature value and the SOC determined in the previous cycle as $\tau$[k+1] of Equation 4 from the third lookup table using the temperature value and the SOC determined in the previous cycle as an index.

To control the switch 30, the control unit 120 may selectively output the switching signal SS. When the definitive estimate $SOC_e$[k+1] is within the reference range, the control unit 120 may regulate the duty cycle of the switching signal SS below a predetermined reference duty cycle (e.g., 0.2). When the duty cycle of the switching signal SS is regulated below the reference duty cycle, a rapid change in the voltage, current and temperature of the battery 20 may be suppressed.

Figure 4:
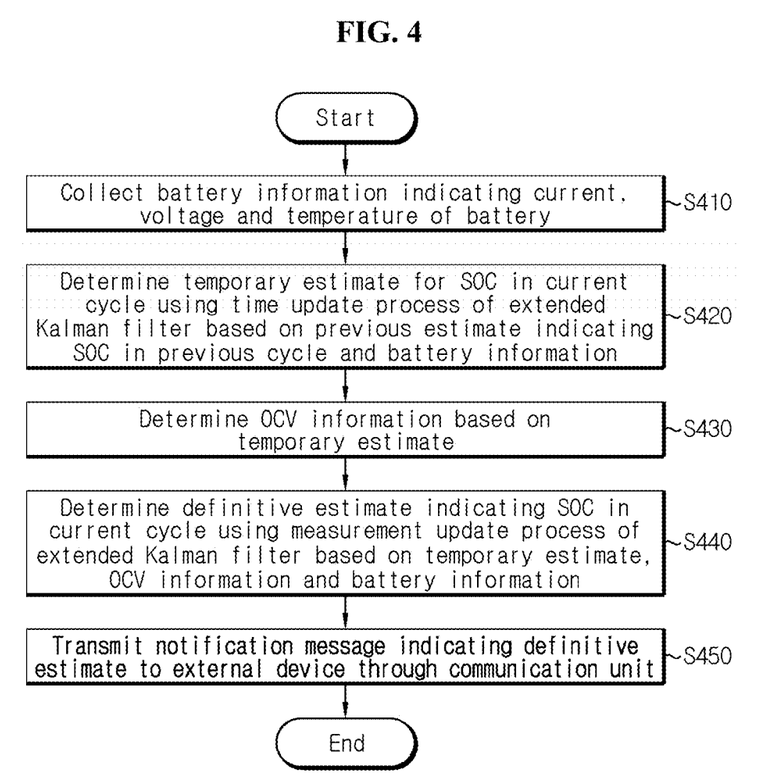
FIG. 4 is an exemplary flowchart showing a battery management method that may be performed by a battery management system of FIG. 1.

FIG. 4 is an exemplary flowchart showing a battery management method that may be performed by the battery management system of FIG. 1. The method of FIG. 4 may be periodically performed from the time point at which the event occurred. The method of FIG. 4 may end when charging/discharging the battery 20 is stopped.

Referring to FIGS. 1 to 4, in step S410, the control unit 120 collects battery information indicating the current, voltage and temperature of the battery 20 from the sensing unit 110.

In step S420, the control unit 120 determines a temporary estimate SOC[k+1] for the SOC in the current cycle using the time update process of the extended Kalman filter based on the previous estimate $SOC_e$[k] indicating the SOC in the previous cycle and the battery information (see Equations 4 and 5).

In step S430, the control unit 120 determines OCV information based on the temporary estimate SOC[k+1].

In step S440, the control unit 120 determines a definitive estimate $SOC_e$[k+1] indicating the SOC in the current cycle using the measurement update process of the extended Kalman filter based on the temporary estimate SOC[k+1], the OCV information and the battery information (see Equations 6 to 8).

In step S450, the control unit 120 transmits a notification message indicating the definitive estimate $SOC_e$[k+1] to the external device 2 through the communication unit 140.

Figure 5:
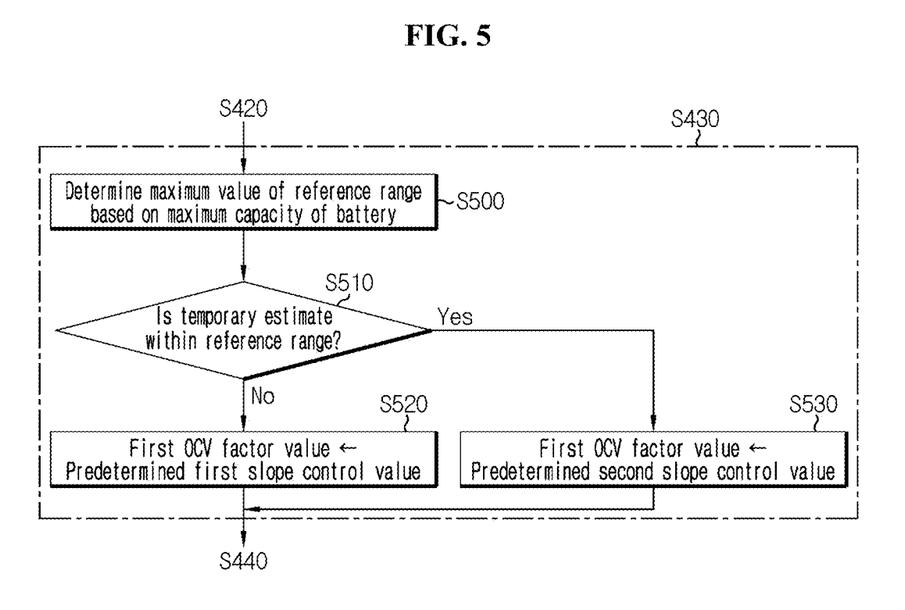
FIG. 5 is an exemplary flowchart showing a method of determining a first OCV factor value as OCV information according to an embodiment of the present disclosure.

FIG. 5 is an exemplary flowchart showing a method of determining the first OCV factor value as the OCV information according to an embodiment of the present disclosure. The method of FIG. 5 corresponds sub-steps of the step S430 of FIG. 4.

Referring to FIGS. 1 to 5, in step S500, the control unit 120 determines the maximum value $SOC_R$ of the reference range based on the maximum capacity $Q_{est}$ of the battery 20. The minimum value of the reference range may be 0%. The step S500 is not essential, and may be omitted from the method of FIG. 5.

In step S510, the control unit 120 determines whether the temporary estimate SOC[k+1] is within the reference range. That is, the control unit 120 determines whether the temporary estimate SOC[k+1] is equal to or less than the maximum value $SOC_R$ of the reference range. When a value of the step S510 is "NO", step S520 is performed. When the value of the step S510 is "YES", step S530 is performed.

In step S520, the control unit 120 determines the first OCV factor value (u in Equation 6) to be equal to the predetermined first slope control value.

In step S530, the control unit 120 determines the first OCV factor value to be equal to the predetermined second slope control value. The second slope control value is smaller than the first slope control value.

Figure 6:
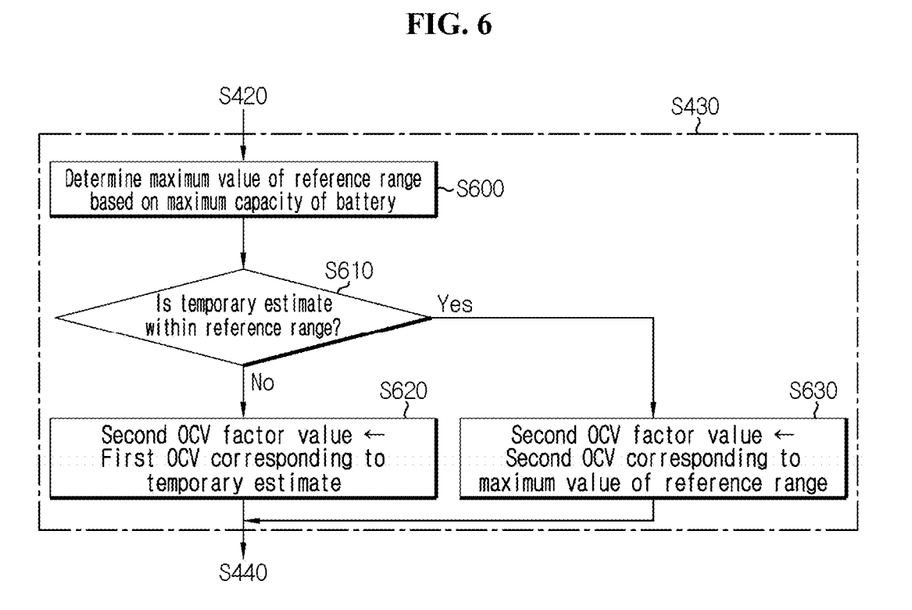
FIG. 6 is an exemplary flowchart showing a method of determining a second OCV factor value as OCV information according to another embodiment of the present disclosure.

FIG. 6 is an exemplary flowchart showing a method of determining the second OCV factor value as the OCV information according to another embodiment of the present disclosure. The method of FIG. 6 corresponds to sub-steps of the step S430 of FIG. 4.

Referring to FIGS. 1 to 4 and 6, in step S600, the control unit 120 determines the maximum value $SOC_R$ of the reference range based on the maximum capacity $Q_{est}$ of the battery 20. The minimum value of the reference range may be 0%. The step S600 is not essential, and may be omitted from the method of FIG. 6.

In step S610, the control unit 120 determines whether the temporary estimate SOC[k+1] is within the reference range. That is, the control unit 120 determines whether the temporary estimate SOC[k+1] is equal to or less than the maximum value $SOC_R$ of the reference range. When a value of the step S610 is "NO", step S620 is performed. When the value of the step S610 is "YES", step S630 is performed.

In step S620, the control unit 120 determines the second OCV factor value ($f_1$(SOC[k+1]) in Equation 7) to be equal to a first OCV corresponding to the temporary estimate SOC[k+1]. For example, referring to FIG. 3, when SOC[k+1]=0.5>$SOC_R$, First OCV=3.3 [V]=Second OCV factor value.

In step S630, the control unit 120 determines the second OCV factor value to be equal to a second OCV VR corresponding to the maximum value $SOC_R$ of the reference range. For example, referring to FIG. 3, when SOC[k+1] ≤$SOC_R$, Second OCV=$V_R$ [V]=Second OCV factor value.

Meanwhile, only one of the method of FIG. 5 and the method of FIG. 6 is not performed, and the two methods may be all performed. When both the method of FIG. 5 and the method of FIG. 6 are performed, only one of the step S500 and the step S600 may be performed.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system, comprising:
a sensing unit configured to generate battery information indicating at least one of a current, a voltage, and a temperature of a battery; and
a control unit configured to:
determine a temporary estimate for a state of charge (SOC) of the battery in a current cycle using a time update process of an extended Kalman filter based on a previous estimate and the battery information from the sensing unit, the previous estimate indicating an SOC of the battery determined in a previous cycle;
determine open circuit voltage (OCV) information based on the temporary estimate for the SOC in the current cycle and on a correspondence relationship between the SOC and the OCV of the battery; and
determine a definitive estimate indicating the SOC in the current cycle using a measurement update process of the extended Kalman filter based on the temporary estimate for the SOC in the current cycle, the determined OCV information, and the battery information from the sensing unit.

2. The battery management system according to claim 1, wherein:
the determined OCV information includes a first OCV factor value; and
in determining the OCV information, the control unit is further configured to:
determine whether the temporary estimate for the SOC in the current cycle is within a preset reference range; and
determine the first OCV factor value is to be equal to a predetermined first slope control value if the temporary estimate for the SOC in the current cycle is outside of the reference range.

3. The battery management system according to claim 2, wherein, in determining the OCV information, the control unit is further configured to determine the first OCV factor value is equal to a second slope control value if the temporary estimate for the SOC in the current cycle is within the reference range, the second slope control value being smaller than the first slope control value.

4. The battery management system according to claim 3, wherein the control unit is further configured to determine a maximum value of the reference range based on a maximum capacity of the battery.

5. The battery management system according to claim 4, wherein the control unit is further configured to increase the maximum value of the reference range as a difference between a design capacity of the battery and the maximum capacity increases.

6. The battery management system according to claim 1, wherein:
the determined OCV information includes a second OCV factor value; and
in determining the OCV information, the control unit is further configured to:
determine whether the temporary estimate for the SOC in the current cycle is within a preset reference range; and
determine that the second OCV factor value is to be equal to a first OCV corresponding to the temporary estimate for the SOC in the current cycle from a data table defining a correspondence relationship between the SOC and the OCV of the battery if the temporary estimate for the SOC in the current cycle is outside of the reference range.

7. The battery management system according to claim 6, wherein:
in determining the OCV information, the control unit is further configured to determine that the second OCV factor value is equal to a second OCV corresponding to a maximum value of the reference range if the temporary estimate for the SOC in the current cycle is within the reference range; and
the maximum value of the reference range is equal to or larger than a predetermined reference value.

8. A battery pack comprising the battery management system according to claim 1.

9. An electric vehicle, comprising:
the battery pack according to claim 8.

10. A battery management method, executable by the battery management system according to claim 1, the battery management method comprising:
collecting battery information indicating at least one of a current, a voltage, and a temperature of the battery;
determining a temporary estimate for a state of charge (SOC) in a current cycle using a time update process of an extended Kalman filter based on a previous estimate indicating an SOC in a previous cycle and the collected battery information;
determining open circuit voltage (OCV) information based on the temporary estimate for the SOC in the current cycle and on a correspondence relationship between the SOC and the OCV of the battery; and
determining a definitive estimate indicating the SOC in the current cycle using a measurement update process of the extended Kalman filter based on the temporary estimate for the SOC in the current cycle, the determined OCV information, and the collected battery information.

11. The battery management method according to claim 10, wherein:
the determining the OCV information comprises:
determining whether the temporary estimate for the SOC in the current cycle is within a preset reference range;
determining a first OCV factor value is equal to a predetermined first slope control value if the temporary estimate for the SOC in the current cycle is outside of the reference range; and
determining the first OCV factor value is equal to a second slope control value if the temporary estimate for the SOC in the current cycle is within the reference range, the second slope control value being smaller than the first slope control value; and
the OCV information includes the first OCV factor value.

12. The battery management method according to claim 10, wherein:
the determining the OCV information comprises:
determining whether the temporary estimate for the SOC in the current cycle is within a preset reference range;
determining a second OCV factor value is equal to an OCV corresponding to the temporary estimate for the SOC in the current cycle from a data table defining a correspondence relationship between the SOC and the OCV of the battery if the temporary estimate for the SOC in the current cycle is outside of the reference range; and
determining the second OCV factor value is equal to a second OCV corresponding to a maximum value of the reference range if the temporary estimate for the SOC in the current cycle is within the reference range; and
the OCV information includes the second OCV factor value.

13. The battery management method according to claim 10, further comprising:
controlling charging or discharging of the battery based on the definitive estimate indicating the SOC in the current cycle.

14. The battery management method according to claim 10, wherein the previous estimate indicating the SOC in the previous cycle is the definitive estimate indicating the SOC determined in the previous cycle.

15. The battery management system according to claim 1, further comprising:
a switch to control charging or discharging of the battery.

16. The battery management system according to claim 15, wherein the control unit is further configured to control the switch based on the definitive estimate indicating the SOC in the current cycle.

17. The battery management system according to claim 1, further comprising:
a memory storing a data table defining the correspondence relationship between the SOC and the OCV of the battery.

18. The battery management system according to claim 1, wherein the previous estimate is the definitive estimate indicating the SOC in the previous cycle determined by the control unit.

* * * * *